United States Patent
Takahashi et al.

(10) Patent No.: US 8,426,311 B2
(45) Date of Patent: Apr. 23, 2013

(54) METHOD AND APPARATUS FOR MANUFACTURING SEMICONDUCTOR DEVICE

(75) Inventors: Nobuaki Takahashi, Kanagawa (JP); Masahiro Komuro, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 386 days.

(21) Appl. No.: 12/801,458

(22) Filed: Jun. 9, 2010

(65) Prior Publication Data
US 2011/0027987 A1    Feb. 3, 2011

(30) Foreign Application Priority Data
Jul. 28, 2009 (JP) ................................ 2009-175739

(51) Int. Cl.
*H01L 21/445* (2006.01)
(52) U.S. Cl.
USPC .................................. 438/678; 257/E21.479
(58) Field of Classification Search .................. 438/652, 438/678; 257/E21.479
See application file for complete search history.

(56) References Cited

U.S. PATENT DOCUMENTS

| | | | |
|---|---|---|---|
| 6,522,009 B2 * | 2/2003 | Lee | 257/758 |
| 2004/0180531 A1 * | 9/2004 | Horikoshi | 438/622 |
| 2005/0104207 A1 * | 5/2005 | Dean et al. | 257/734 |
| 2010/0059257 A1 * | 3/2010 | Choi et al. | 174/257 |
| 2010/0183898 A1 * | 7/2010 | Imai et al. | 428/672 |

FOREIGN PATENT DOCUMENTS
JP    2004-273958 A    9/2004
WO   WO 2008153026 A1 * 12/2008

* cited by examiner

*Primary Examiner* — William D Coleman
*Assistant Examiner* — Christine Enad
(74) *Attorney, Agent, or Firm* — McGinn IP Law Group, PLLC

(57) ABSTRACT

A method for manufacturing a semiconductor device includes forming a laminated structure of a plurality of metal films on a semiconductor substrate using an electroless plating method. The forming of the metal films includes: performing an electroless plating process including a reduction reaction using a first plating tank; and performing an electroless plating process by only a substitution reaction using a second plating tank. The electroless plating process including the reduction reaction that is performed using the first plating tank is performed in a shading environment, and the electroless plating process performed by only the substitution reaction using the second plating tank is performed in a non-shading environment.

20 Claims, 11 Drawing Sheets

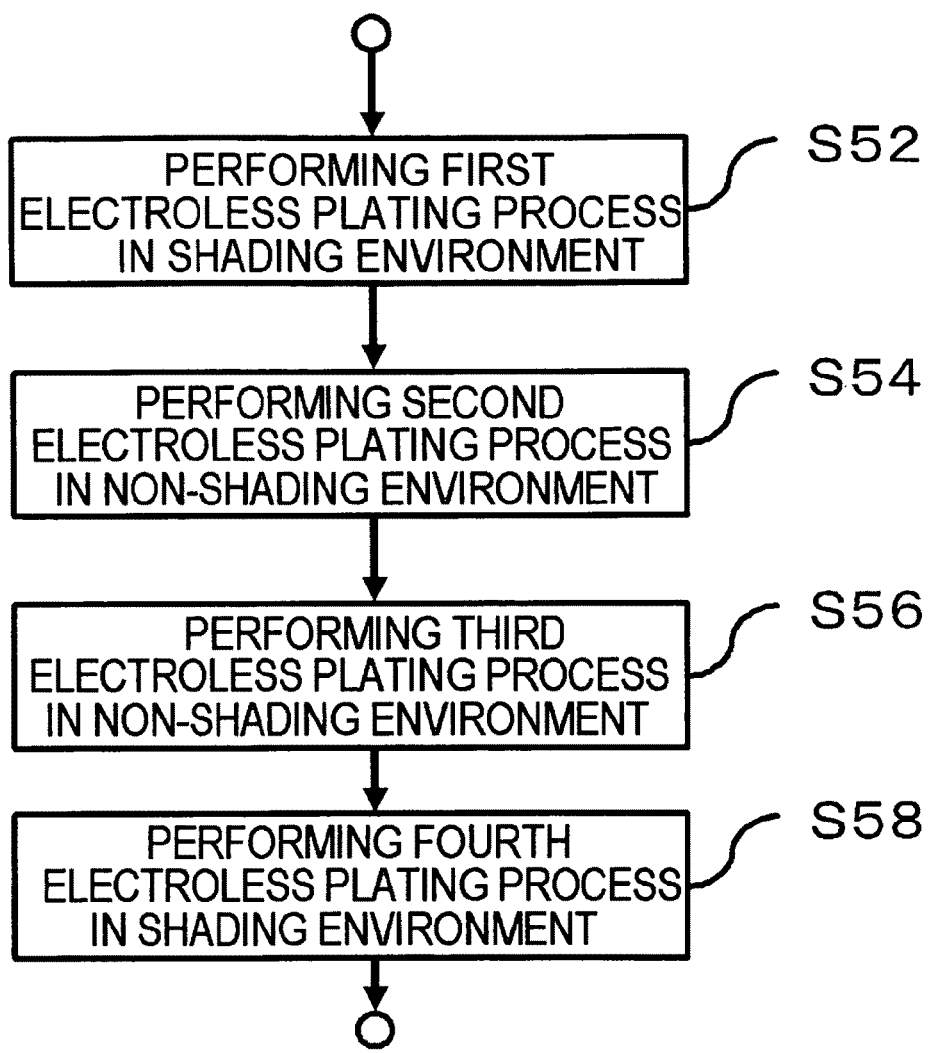

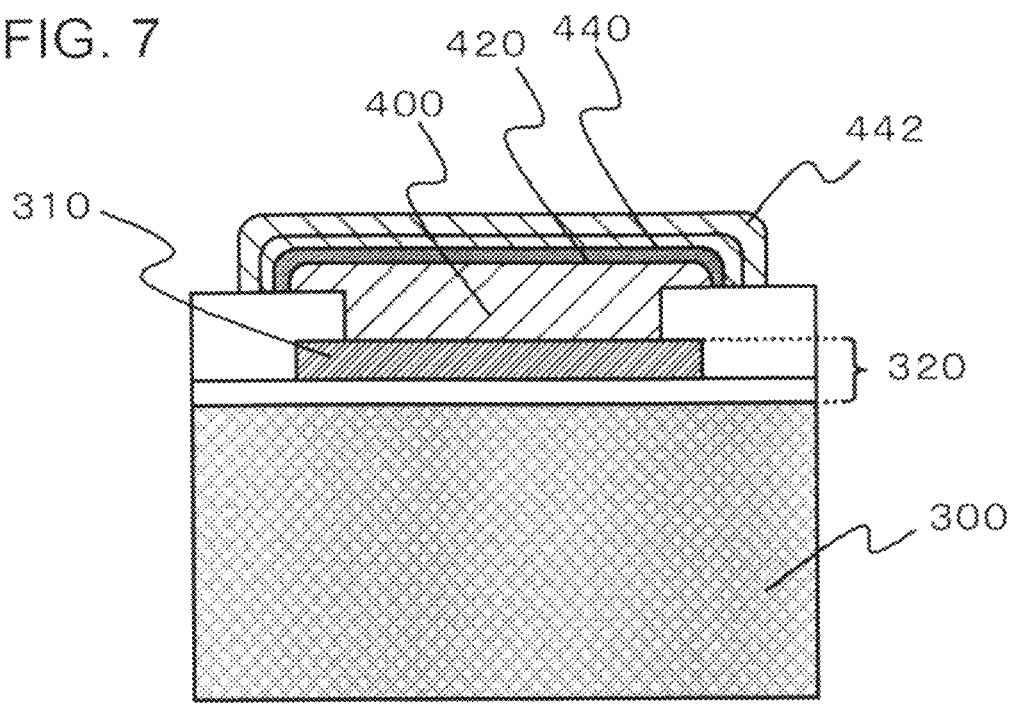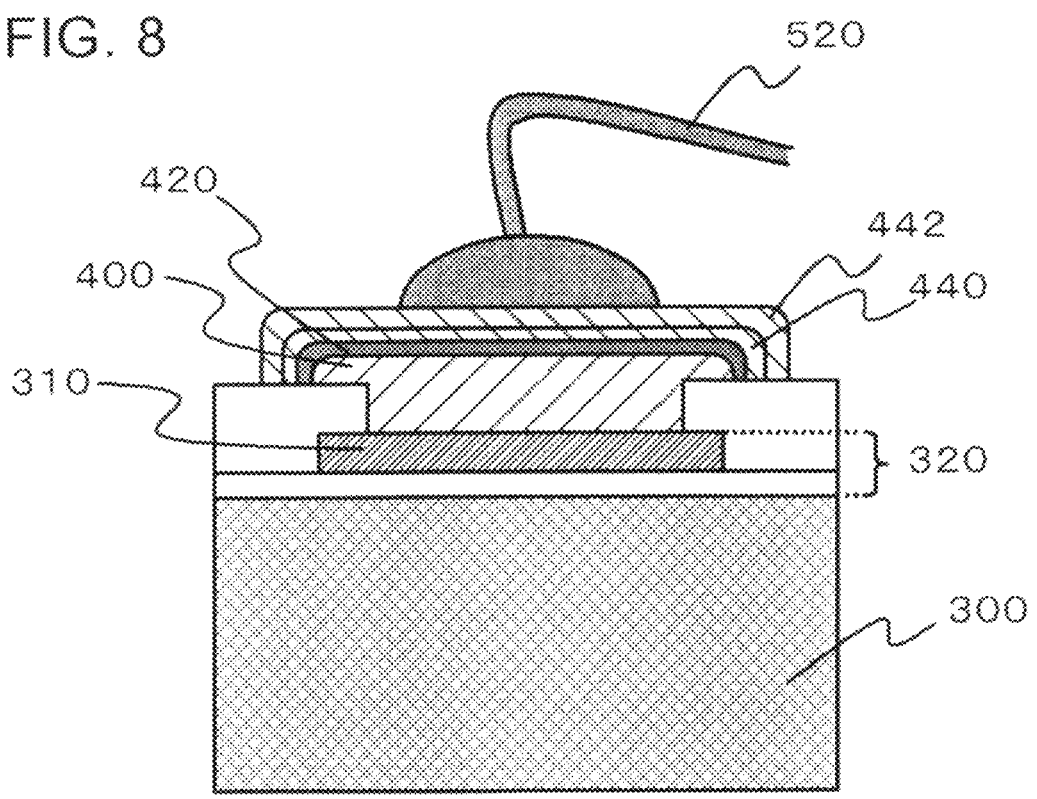

METHOD AND APPARATUS FOR MANUFACTURING SEMICONDUCTOR DEVICE

This application is based on Japanese patent application No. 2009-175739, the content of which is incorporated hereinto by reference.

BACKGROUND

1. Technical Field

The present invention relates to a method and an apparatus for manufacturing a semiconductor device.

2. Related Art

A metal film for connecting, for example, a wire or a bump is formed on an electrode of a semiconductor device. One of the methods of forming the metal film is an electroless plating method.

The electrode of the semiconductor device is connected to a semiconductor element that is formed on a substrate. The semiconductor element includes a junction region between a p-type impurity region and an n-type impurity region. When light is incident on the junction region, photovoltaic power is generated between an electrode connected to the p-type impurity region and an electrode connected to the n-type impurity region by the photoelectric effect. Therefore, when light is incident on the semiconductor device that is being processed by the electroless plating method, the thickness of a plating metal film is uneven between the electrode connected to the p-type impurity region and the electrode connected to the n-type impurity region.

Japanese Laid-open patent publication NO. 2004-273958 discloses a technique in which, when a chemical treatment is performed on a semiconductor substrate and a water washing process is performed on the semiconductor substrate, a chemical treatment tank is disposed in a shading environment and a water washing tank is disposed in a non-shading environment.

SUMMARY

In recent years, a multi-layer structure including a plurality of plating metal films has been used as a metal film on the electrode. In this case, a plurality of plating tanks is prepared for electroless plating. However, when all of the plating tanks are disposed in the shading environment, initial costs required for constructing the plating tanks increase. In addition, since it is difficult to visually monitor the plating tanks, it takes a lot of efforts to manage a process. Therefore, it is preferable to reduce the number of plating tanks disposed in the shading environment.

In one embodiment, there is provided a method for manufacturing a semiconductor device. The method includes forming a laminated structure of a plurality of metal films on a semiconductor substrate using an electroless plating method. The forming of the metal films includes: performing an electroless plating process including a reduction reaction using a first plating tank; and performing an electroless plating process by only a substitution reaction using a second plating tank. The electroless plating process including the reduction reaction that is performed using the first plating tank is performed in a shading environment, and the electroless plating process performed by only the substitution reaction using the second plating tank is performed in a non-shading environment.

In another embodiment, there is provided an apparatus for manufacturing a semiconductor device that forms a laminated structure of a plurality of metal films on a semiconductor substrate using an electroless plating method. The apparatus includes: a first plating tank that performs an electroless plating process including a reduction reaction in a shading environment; and a second plating tank that performs an electroless plating process by only a substitution reaction in a non-shading environment.

The electroless plating process including the reduction reaction includes a case in which a portion of the entire process of forming a film using the plating method involves the reduction reaction as well as a case in which the entire process of forming a film using the plating method involves the reduction reaction. The electroless plating process by only the substitution reaction means that the entire process of forming a film using the plating method is performed by the substitution reaction, but the process of forming a film using the plating method does not involve the reduction reaction.

The inventors have examined the relationship between the influence of photovoltaic power from the semiconductor element and a reaction mechanism in a process of forming a film using an electroless plating method. As a result of the examination, in the electroless plating process involving the reduction reaction, the deposition rate strongly depends on the photovoltaic power. However, in the electroless plating process performed by only the substitution reaction, the deposition rate hardly depends on the photovoltaic power. That is, the inventors found that the influence of the photovoltaic power was large in the electroless plating process involving the reduction reaction, but it did not have to be considered in the electroless plating process performed by only the substitution reaction. This means that the plating process performed by only the substitution reaction does not need a shading environment requiring complicated equipment. In this case, the plating process performed by only the substitution reaction means that the entire film forming process is performed by the substitution reaction, but does not involve the reduction reaction, which will be described below.

The following two cases (1) and (2) may occur depending on a material forming the plating film or an additive (for example, a reducing agent) in a plating solution: (1) when the entire film forming process involves the reduction reaction or the substitution reaction; and (2) the film forming process involves the substitution reaction at the beginning of the process and then involves the reduction reaction (the boundary between the substitution reaction and the reduction reaction is a given thickness). In the case (1), the film forming process is performed by only the reduction reaction. However, in the case (2), when the reaction mechanism is changed, the deposition rate is rapidly changed by the influence of photovoltaic power during deposition, which results in a variation in the thickness of the film in each deposition lot. In order to prevent the variation in thickness, the entire deposition process needs to be performed while involving the reduction reaction and an electroless plating process including the reduction reaction in a portion of the entire deposition process needs to be performed in a shading environment.

In the invention, the boundary between when the plating process is performed in a non-shading environment and when the plating process is performed in a shading environment is set based on the reaction mechanism in the process of forming a film using an electroless plating method. That is, the electroless plating process in which the entire film forming process does not include the reduction reaction, but is performed by only the substitution reaction is performed in the non-shading environment, and the electroless plating process in which a portion of the entire film forming process includes the reduction reaction is performed in the shading environment.

In this way, it is possible to provide a method and an apparatus for manufacturing a semiconductor device that is capable of simplifying the structure of manufacturing equipment and reducing a process monitoring load.

According to the above-mentioned embodiments of the invention, it is possible to reduce the number of plating tanks disposed in a shading environment.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 is a flowchart illustrating a main part of a method for manufacturing a semiconductor device according to a second embodiment;

FIG. 7 is a cross-sectional view illustrating a substrate (semiconductor device) after processing in the second embodiment;

FIG. 8 is a cross-sectional view illustrating the connection of a bonding wire to an electrode pad of the substrate shown in FIG. 7;

DETAILED DESCRIPTION

Figure 1:
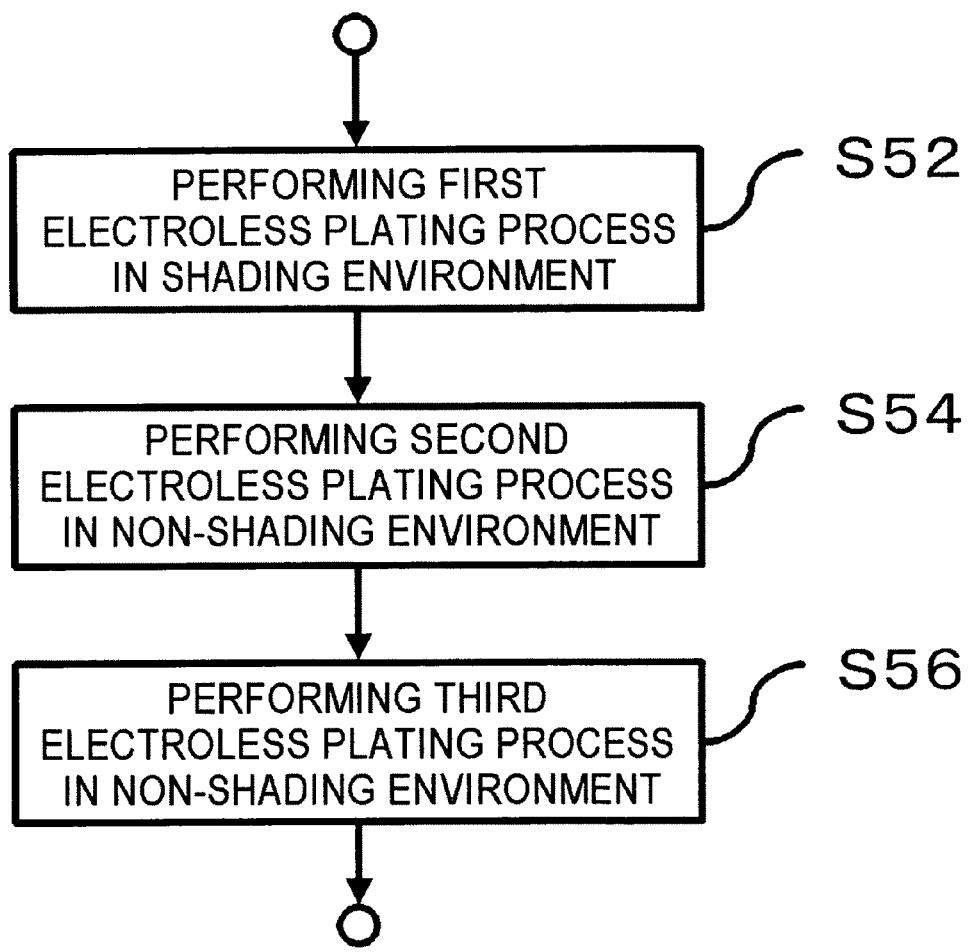
FIG. 1 is a flowchart illustrating a main part of a method for manufacturing a semiconductor device according to a first embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described with reference to the accompanying drawings. In the drawings, the similar components are denoted by the same reference numerals and a description thereof will not be repeated.

In the following embodiments, the term 'reduction reaction' means a chemical reaction in which a target material receives electrons. In addition, a material for promoting the reaction is referred to as a 'reducing agent'. For example, the reduction reaction in electroless nickel plating means a reaction in which nickel ions receive electrons emitted from a hypophosphorous acid which is added as a reducing agent to a plating solution and nickel metal is precipitated.

The term 'substitution reaction' means a reaction in which a metal element with a relatively strong ionization tendency is ionized and another metal element with a relatively weak ionization tendency is precipitated so as to be substituted with the metal element. For example, in the substitution reaction during gold plating, when nickel metal is immersed into a plating solution, nickel with relatively strong ionization tendency is ionized, and gold with a relatively weak ionization tendency is precipitated on nickel so as to be substituted with nickel.

(First Embodiment)

FIG. 1 is a flowchart illustrating a main part of a method for manufacturing a semiconductor device according to a first embodiment of the invention. The method for manufacturing a semiconductor device includes a process of forming a first plating film on an electrode of the semiconductor device (Step S52), a process of forming a second plating film on the first plating film (Step S54), and a process of forming a third plating film on the second plating film (Step S56). In the process (Step S52) of forming the first plating film, a substrate having the electrode formed thereon is immersed in a first plating tank, and a first electroless plating process using a reduction reaction is performed on the electrode to form the first plating film on the electrode. In the process (Step S54) of forming the second plating film, the substrate is immersed in a second plating tank, and a second electroless plating process is performed on the electrode in a non-shading environment to form the second plating film on the first plating film. The second plating film is thinner than the first plating film. In the process (Step S56) of forming the third plating film, the substrate is immersed in a third plating tank and a third electroless plating process is performed on the electrode to form the third plating film on the second plating film.

The inventors' examination provided that, in the electroless plating process involving the reduction reaction, the deposition rate strongly depended on photovoltaic power, but in the electroless plating process performed by only the substitution reaction, the deposition rate hardly depended on the photovoltaic power. That is, the inventors found that the influence of the photovoltaic power in the electroless plating process involving the reduction reaction was large, but the influence of the photovoltaic power in the electroless plating process performed by only the substitution reaction did not have to be considered. The first plating film is subjected to the reduction reaction, and the process of forming the second plating film is performed by the substitution reaction without involving the reduction reaction. In this embodiment, the first plating film is formed in the shading environment, and the second plating film is formed in a non-shading environment. For example, the plating process is performed by only the substitution reaction when a plating film is thin and the plating process ends before the reduction reaction occurs. Even though the reducing agent is included in the plating solution, the plating process is performed by only the substitution reaction at the beginning of the plating process when a base has a strong ionization tendency.

The electrode formed on the substrate may be an electrode pad for connection to an external terminal or an electrode for connection to a through electrode. The electrode may be a single-layer metal film or a multi-layer metal film. The outermost layer of the electrode is made of at least one of Cu, a Cu alloy, Al, an Al alloy, W, a W alloy, Ag, and an Ag alloy. For example, the electrode may have a structure in which TiW, Ti, and Cu films are laminated in this order and the laminate is plated with Ni and Cu in this order.

The first plating film is a Ni film or a metal film (for example, a NiP film or a NiB film) including Ni. The second plating film is a Pd film or a metal film (for example, a PdP alloy) including Pd. The third plating film is an Au film. For example, the thickness of the first plating film is equal to or more than 1 µm and equal to or less than 100 µm. The second plating film is thinner than the first plating film. For example, the thickness of the second plating film is equal to or more than 0.1 µm and equal to or less than 0.3 µm. The third plating film is thinner than the second plating film. For example, the thickness of the third plating film is equal to or more than 0.01 µm and equal to or less than 0.05 µm. In this embodiment, since the third plating film is also formed by only the substitution reaction, the process (Step S56) of forming the third plating film is also performed in the non-shading environment.

Figure 2:
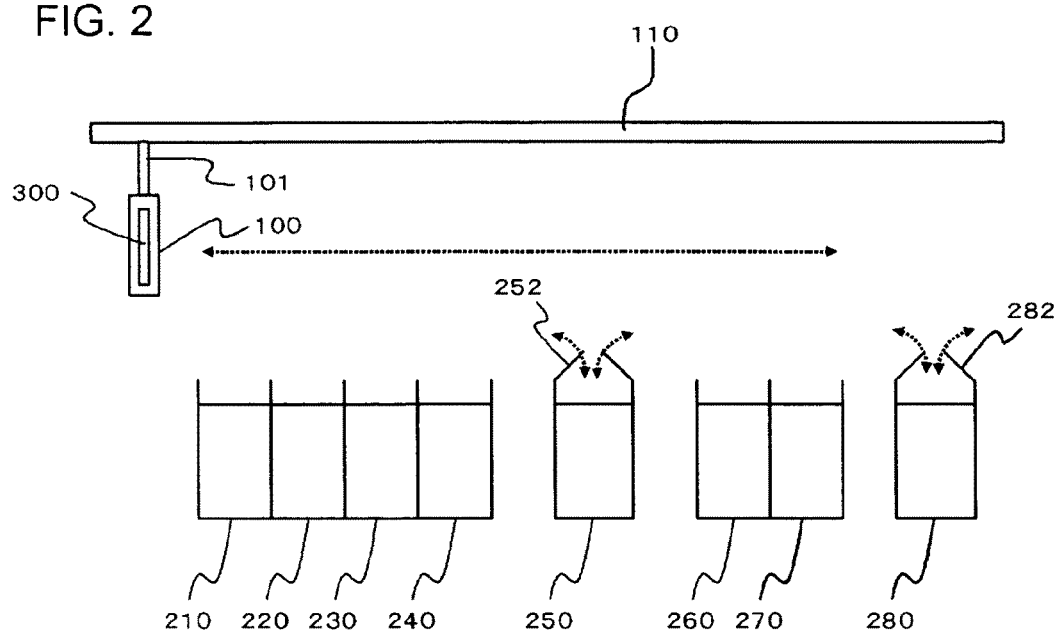
FIG. 2 is a diagram illustrating the structure of a semiconductor manufacturing apparatus according to the first embodiment.

FIG. 2 is a diagram illustrating the structure of a semiconductor manufacturing apparatus according to this embodiment. The semiconductor manufacturing apparatus includes a holder 100, a rail 110, a defatting tank 210, an oxide film removing tank 220, an activating tank 230, an acidizing tank 240, a first plating tank 250, a second plating tank 260, a third plating tank 270, and a fourth plating tank 280.

The holder 100 holds a substrate 300. The rail 110 is connected such that an arm 101 of the holder 100 can be moved in the direction represented by a straight dotted line in FIG. 2. The defatting tank 210 stores a cleaning solution for removing oil and fat components adhered to the surface of the substrate 300 (including the surface of the electrode). The oxide film removing tank 220 stores an etchant for removing an oxide film that is formed on the surface of the electrode. The activating tank 230 stores a treatment solution for facilitating the formation of an electroless plating film on the surface of the electrode. The process is, for example, a nucleation process for growing the first plating film. When the base (electrode) is made of Cu or W and the first plating film is made of Ni, the nucleus of Pd is the nucleus of the growth of the plating film. The acidizing tank 240 stores an acid washing solution for removing nuclei formed on the surface of the electrode.

The first plating tank 250 stores a plating solution for forming the first plating film using an electroless plating method. The plating solution includes a reducing agent. Therefore, when the holder 100 holding the substrate 300 is immersed, the first electroless plating process using the reduction reaction is performed on the electrode of the substrate 300 to form the first plating film on the electrode. The first plating tank 250 has an openable cover 252. The cover 252 is opened to immerse the holder 100. When the holder 100 is immersed, the cover 252 is closed to perform the first electroless plating process in the shading environment. A hole (not shown) for preventing the interference between the cover 252 and the arm 101 is formed in the cover 252. It is preferable that the cover 252 be made of a material that does not transmit light and is not corroded by the plating solution.

The second plating tank 260 stores a plating solution for forming the second plating film using the electroless plating method. The plating solution includes a reducing agent. However, as described above, since the second plating film is formed with a small thickness, the second plating film is formed by only the substitution reaction. The second plating film is formed in the non-shading environment.

The third plating tank 270 stores a plating solution for forming the third plating film using the electroless plating method. The plating solution does not include a reducing agent. Therefore, the second plating film is formed by the substitution reaction. The third plating film is formed in the non-shading environment.

The fourth plating tank 280 stores a plating solution for forming the fourth plating film on the third plating film using the electroless plating method. The fourth plating film is made of the same material as that forming the third plating film, and is thicker than the third plating film. The plating solution in the fourth plating tank 280 includes a reducing agent. Therefore, the fourth plating film is formed by an electroless plating process including the reduction reaction. The fourth plating tank 280 includes an openable cover 282. The cover 282 has the same structure as the cover 252. The cover 282 is opened to immerse the holder 100. When the holder 100 is immersed, the cover 282 is closed to perform the electroless plating process in the shading environment. It is preferable that the cover 282 be made of a material that does not transmit light and is not corroded by the plating solution.

In the example shown in FIG. 1, the fourth plating tank 280 is not used. Each treatment tank shown in FIG. 2 includes a water washing tank (not shown) for cleaning the processed substrate 300. A water washing process in these water washing tanks is performed in the non-shading environment.

Figure 3:
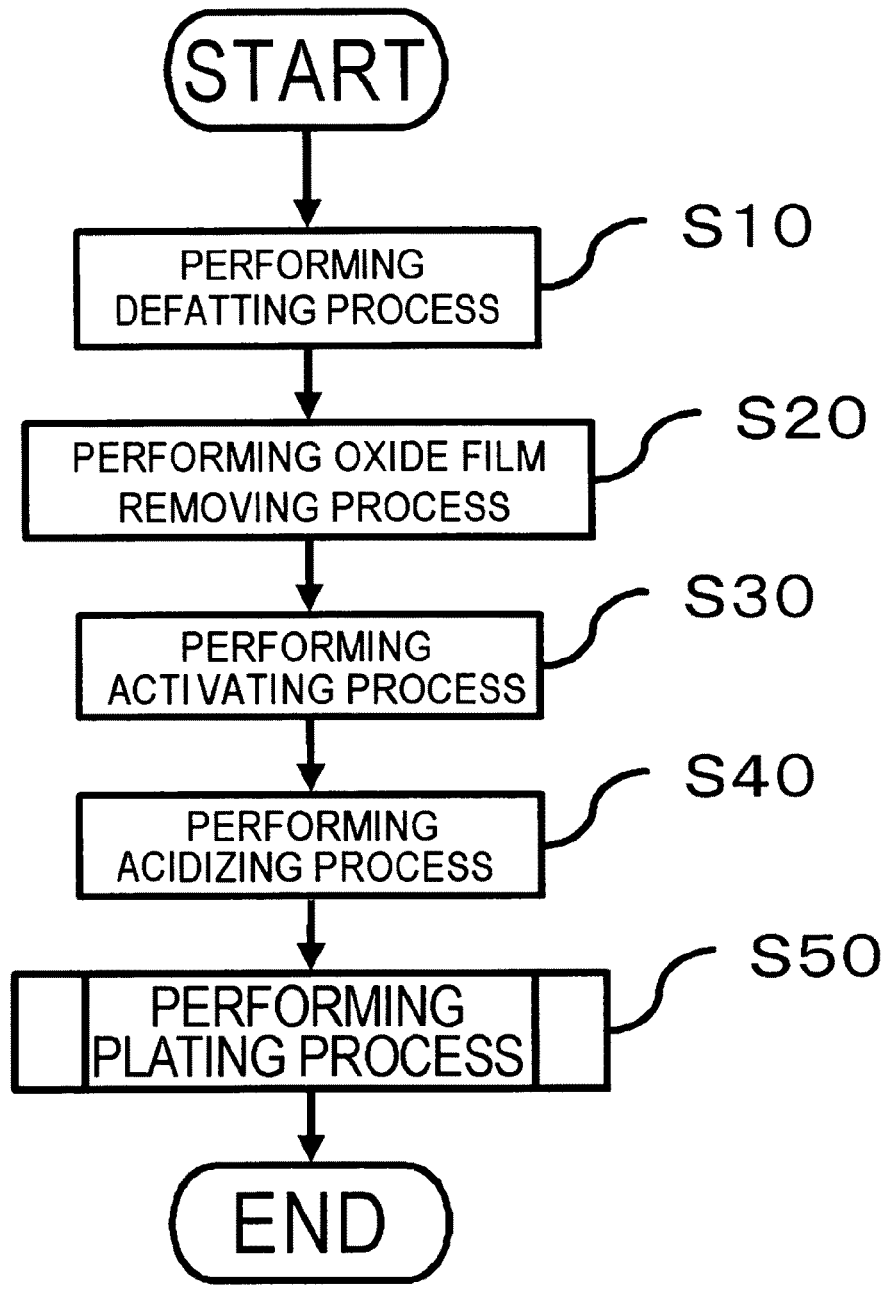
FIG. 3 is a flowchart illustrating the entire method for manufacturing the semiconductor device according to the first embodiment.

FIG. 3 is a flowchart illustrating the entire method for manufacturing the semiconductor device according to this embodiment. The process shown in FIG. 3 is performed when the electrode is a metal layer made of at least one of Cu, a metal material including Cu, Al, a metal material including Al, W, a metal material including W, Ag, and a metal material including Ag, or a laminated structure thereof, for example, when the electrode is a Cu film or a metal film including Cu. First, the substrate 300 is held by the holder 100. A semiconductor element, such as a transistor, and multiple interconnect layers are formed on the substrate 300. The electrode having the first to third plating films formed thereon is provided on any interconnect layer. The electrode includes an electrode pad and a through electrode.

Then, the holder 100 is moved along the rail 110 so as to be disposed above the defatting tank 210. Then, the holder 100 is moved down and immersed in the cleaning solution of the defatting tank 210. In this way, oil and fat components adhered to the surface of the substrate 300 including the surface of the electrode are removed (Step S10).

Then, the holder 100 is lifted up and moved along the rail 110 so as to be disposed above the oxide film removing tank 220. Then, the holder 100 is moved down and immersed in the etchant of the oxide film removing tank 220. In this way, the oxide film formed on the surface of the electrode on the substrate 300 is removed (Step S20).

Then, the holder 100 is lifted up and moved along the rail 110 so as to be disposed above the activating tank 230. Then, the holder 100 is moved down and immersed in the treatment solution of the activating tank 230. In this way, nuclei for growing the first plating film are generated on the surface of the electrode on the substrate 300 (Step S30). In this case, the nuclei are likely to be generated in portions other than the electrode on the substrate 300.

Then, the holder 100 is lifted up and moved along the rail 110 so as to be disposed above the acidizing tank 240. Then, the holder 100 is moved down and immersed in the treatment solution of the acidizing tank 240. In this way, the nuclei generated in portions other than the electrode of the substrate 300 are removed (Step S40).

Then, the first plating tank 250, the second plating tank 260, and the third plating tank 270 are used to form the first plating film, the second plating film, and the third plating film (Step S50). The formation of the first to third plating films has been described in detail with reference to FIG. 1.

Figure 4:
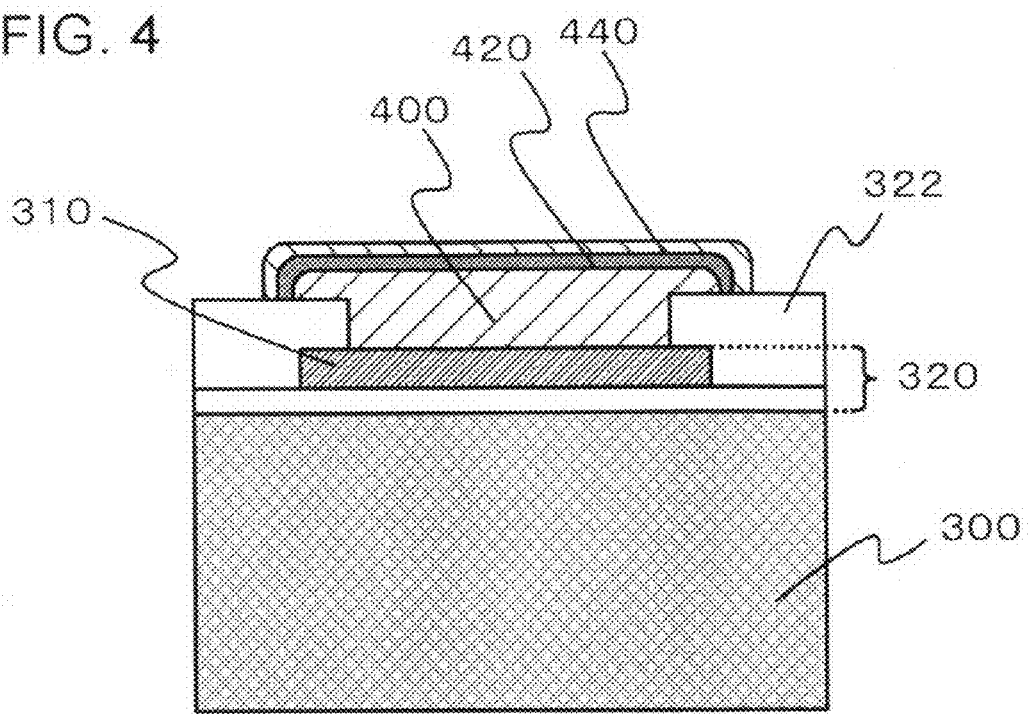
FIG. 4 is a cross-sectional view illustrating a substrate (semiconductor device) after processing in the first embodiment.

FIG. 4 is a cross-sectional view illustrating the processed substrate 300 (semiconductor device) according to this embodiment. The substrate 300 is a semiconductor substrate, such as a silicon substrate, and has a semiconductor element (not shown), such as a transistor, formed thereon. A multi-layer interconnect 320 is formed on the surface of the substrate 300. An electrode pad 310 is formed in the uppermost interconnect layer of the multi-layer interconnect 320. A protective film 322 is formed on the uppermost layer of the multi-layer interconnect 320. An opening through which the electrode pad 310 is exposed is formed in the protective film 322.

A first plating film 400, a second plating film 420, and a third plating film 440 are formed on the electrode pad 310. The first plating film 400, the second plating film 420, and the third plating film 440 are provided to connect the solder bump 500 to the electrode pad 310. When the electrode pad 310 is made of Cu, the first plating film 400 is a Ni-plated film with a thickness equal to or more than 1 μm and equal to or less than 10 μm, and the second plating film 420 is a Pd-plated film with a thickness equal to or more than 0.1 μm and equal to or less than 0.3 μm. The third plating film 440 is an Au-plated film with a thickness equal to or more than 0.01 μm and equal to or less than 0.05 μm.

Figure 5:
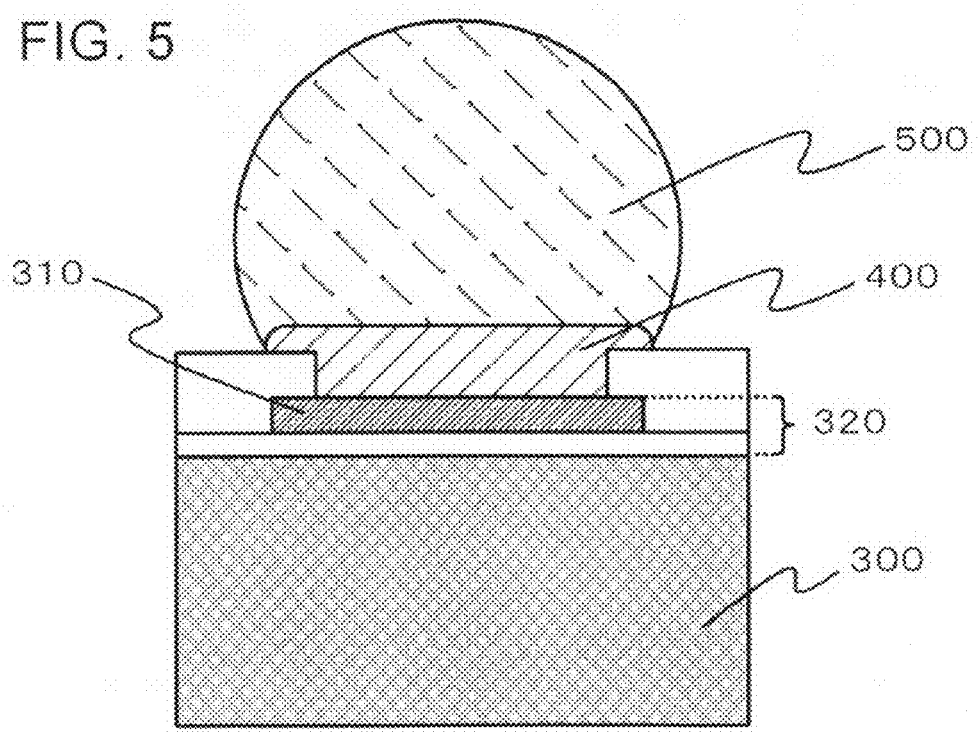
FIG. 5 is a cross-sectional view illustrating the connection of a solder bump to an electrode pad of the substrate shown in FIG. 4.

FIG. 5 is a cross-sectional view illustrating the connection of the solder bump 500 to the electrode pad 310 of the substrate 300 shown in FIG. 4. The second plating film 420 and the third plating film 440 shown in FIG. 4 are melted in the solder bump 500 and are not shown.

Next, the operation and effects of this embodiment will be described. As described above, in the electroless plating process involving the reduction reaction, the deposition rate strongly depends on the photovoltaic power. However, in the electroless plating process performed by only the substitution reaction, the deposition rate hardly depends on the photovoltaic power. The second plating film 420 is thinner than the first plating film 400, and is formed with a necessary thickness by the substitution reaction that occurs at the beginning of the electroless plating process. Therefore, even when the second plating tank 260 is disposed in the non-shading environment, it is possible to prevent the thickness of the second plating film 420 from being uneven between a plurality of electrode pads 310 on the substrate 300 due to the photovoltaic power. Therefore, it is possible to reduce the number of plating tanks disposed in the shading environment.

Since the third plating film 440 formed on the second plating film 420 is thin, the third plating film 440 is formed with a necessary thickness by the substitution reaction that occurs at the beginning of the electroless plating process. Therefore, even when the third plating tank 270 is disposed in the non-shading environment, it is possible to prevent the thickness of the third plating film 440 from being uneven between a plurality of electrode pads 310 on the substrate 300 due to the photovoltaic power. Therefore, it is possible to reduce the number of plating tanks disposed in the shading environment.

(Second Embodiment)

FIG. 6 is a flowchart illustrating a main part of a method for manufacturing a semiconductor device according to a second embodiment, and corresponds to FIG. 1 according to the first embodiment. The method for manufacturing the semiconductor device according to this embodiment is similar to that according to the first embodiment except that a fourth plating film is formed on the third plating film 440.

Specifically, after the third plating film 440 is formed, the holder 100 shown in FIG. 2 is immersed in the fourth plating tank 280. In this way, a fourth electroless plating process is performed on the substrate 300 to form the fourth plating film on the third plating film 440. As described above, the fourth plating film is made of the same material as that forming the third plating film and is thicker than the third plating film. The fourth plating film is formed on the fourth plating tank 280 by the electroless plating process using the reduction reaction. Therefore, the fourth plating film is formed by the reduction reaction in the shading environment. The structure of the fourth plating tank 280 has been described with reference to FIG. 2 in the first embodiment.

FIG. 7 is a cross-sectional view illustrating the processed substrate 300 (semiconductor device) according to this embodiment. The substrate 300 according to this embodiment has the same structure as the substrate 300 according to the first embodiment shown in FIG. 4 except that a fourth plating film 442 is formed on the third plating film 440. The fourth plating film 442 is a metal film made of the same material as that forming the third plating film 440. For example, the fourth plating film 442 is an Au film, and the thickness thereof is equal to or more than 0.03 μm and equal to or less than 1 μm. A solder bump or a bonding wire is connected to the electrode pad 310. The boundary between the third plating film 440 and the fourth plating film 442 is likely to be unclear.

FIG. 8 is a cross-sectional view illustrating the connection of a bonding wire 520 to the electrode pad 310 of the substrate 300 shown in FIG. 7. A portion of the bonding wire 520 connected to the fourth plating film 442 has a ball shape.

In this embodiment, it is possible to obtain the same effects as those in the first embodiment.

(Third Embodiment)

Figure 9:
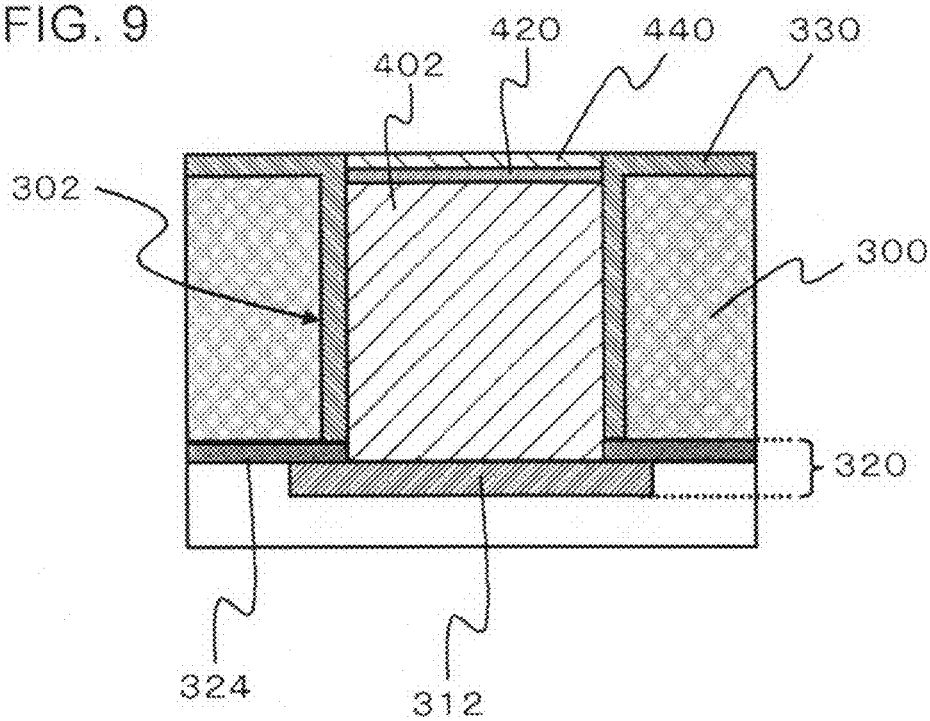
FIG. 9 is a cross-sectional view illustrating the structure of a semiconductor device manufactured by a method for manufacturing a semiconductor device according to a third embodiment.

FIG. 9 is a cross-sectional view illustrating the structure of a semiconductor device manufactured by a method for manufacturing a semiconductor device according to a third embodiment. The semiconductor device has the same structure as the semiconductor device (the substrate 300) according to the first embodiment except for the following points.

The semiconductor device includes an electrode 312 instead of the electrode pad 310. The electrode 312 is formed in the multi-layer interconnect 320 that is provided on the surface of the substrate 300. The electrode 312 is insulated from the substrate 300 by an insulating film 324 that is formed on the surface of the substrate 300.

A through hole 302 is formed in the substrate 300. For example, the through hole 302 is formed by polishing the rear surface of the substrate 300 to reduce the thickness of the substrate 300 and performing dry etching on the substrate 300 from the rear surface. An insulating film 330 is formed on the inner surface of the through hole 302 and the rear surface of the substrate 300. For example, the insulating film 330 is formed by a CVD method after the through hole 302 is formed. A through electrode 402 is provided in the through hole 302. The through electrode 402 is connected to the electrode 312 and is formed by the electroless plating process in the first plating tank 250. One end surface of the through electrode 402 opposite to the electrode 312 does not protrude from the rear surface of the substrate 300. The second plating film 420 and the third plating film 440 are formed on the end surface. The thicknesses of the second plating film 420 and the third plating film 440 are the same as those in the first embodiment.

Figure 10:
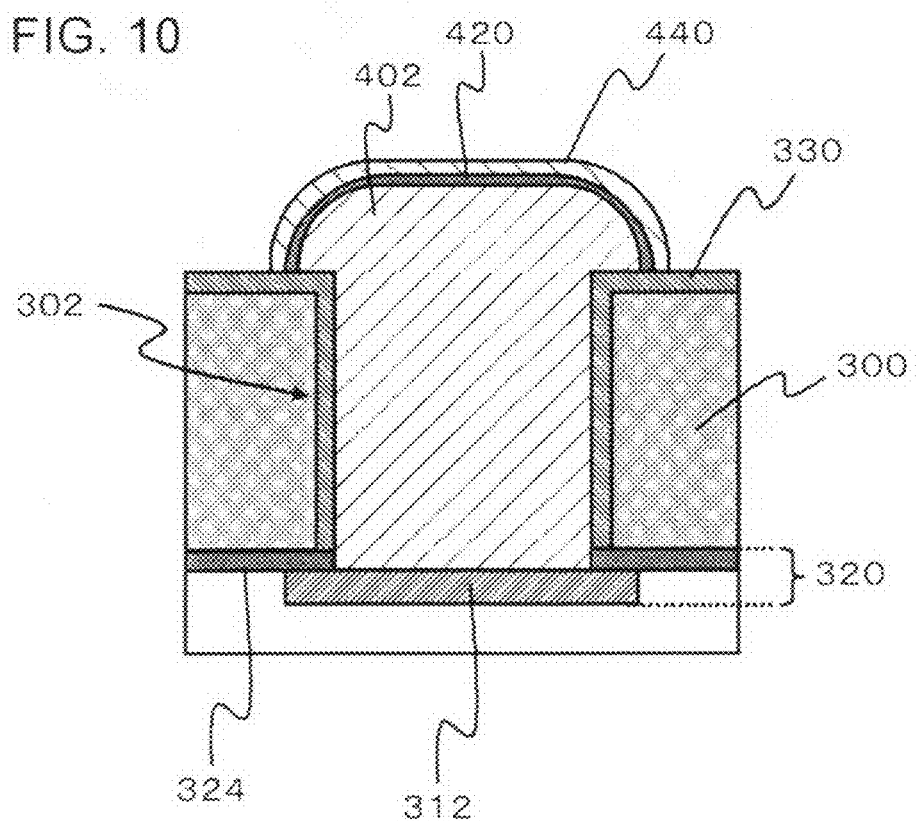
FIG. 10 is a cross-sectional view illustrating a modification of the third embodiment.

FIG. 10 is a cross-sectional view illustrating a modification of the third embodiment. In the example shown in FIG. 10, one end surface of a through electrode 402 opposite to the electrode 312 protrudes from the rear surface of the substrate 300 and serves as a bump. The second plating film 420 and the third plating film 440 are formed on the surface of the bump.

In this embodiment, it is possible to obtain the same effects as those in the first embodiment.

Figure 11:
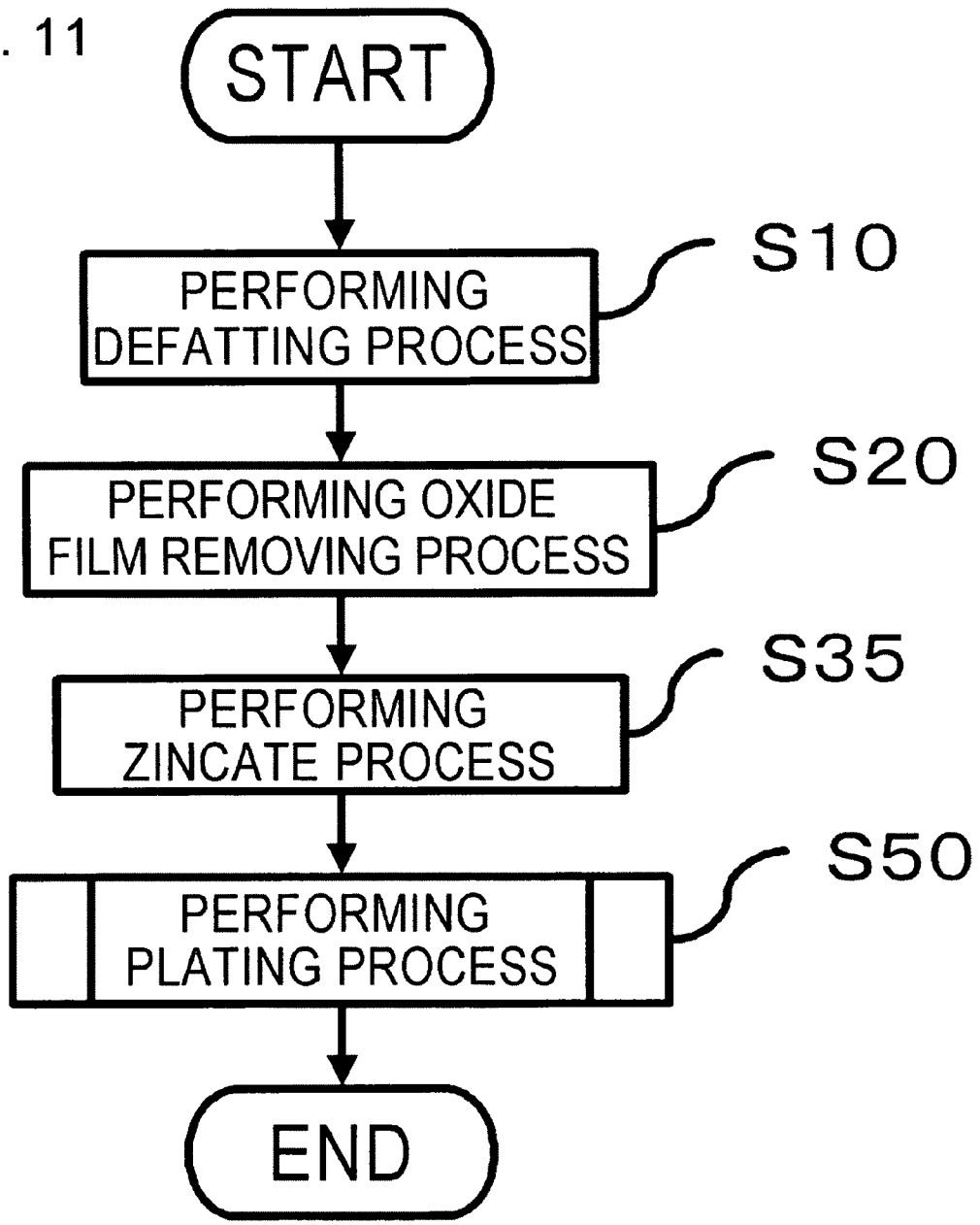
FIG. 11 is a flowchart illustrating a method for manufacturing a semiconductor device according to a fourth embodiment.

FIG. 11 is a flowchart illustrating a method for manufacturing a semiconductor device according to a fourth embodiment, and corresponds to FIG. 3 according to the first embodiment. The method for manufacturing the semiconductor device is used when the electrode of the substrate 300 is made of Al or an Al alloy.

The method for manufacturing the semiconductor device according to this embodiment is the same as those according to the first to third embodiments except that a zincate process (Step S35) is performed instead of the process of generating nuclei for growing the first plating film (Step S30) and the process of removing the remaining nuclei (Step S40). A semiconductor manufacturing apparatus used in this embodiment has the same structure as the semiconductor manufacturing apparatus used in the first embodiment shown in FIG. 2 except that it includes a zincate treatment tank instead of the activating tank 230 and the acidizing tank 240.

In this embodiment, it is possible to obtain the same effects as those in the first embodiment.

Figure 12:
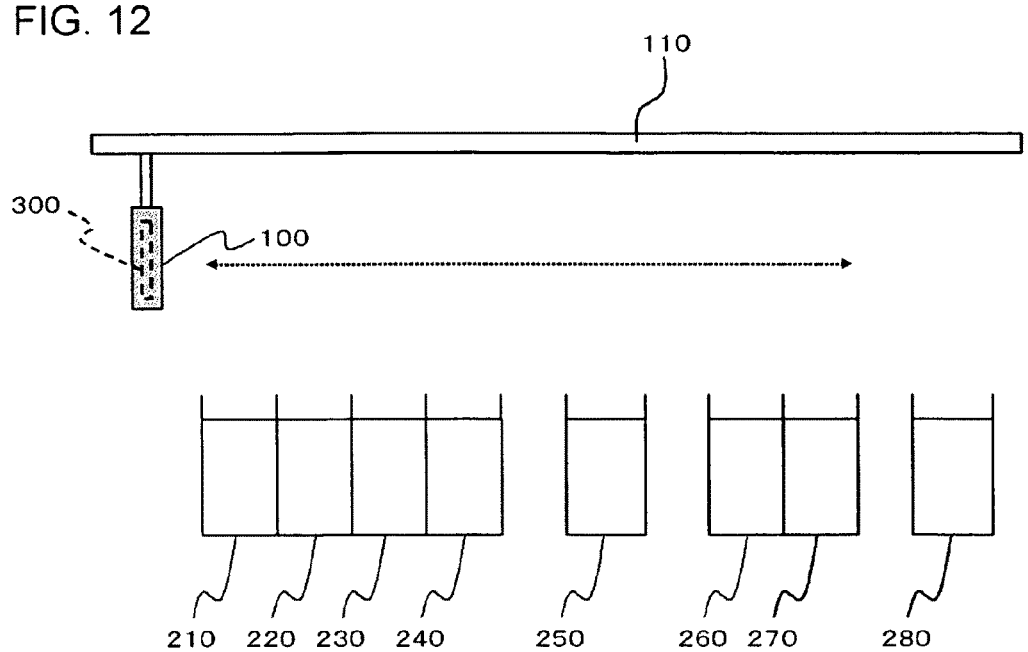
FIG. 12 is a diagram illustrating the structure of a semiconductor manufacturing apparatus according to a fifth embodiment.

FIG. 12 is a diagram illustrating the structure of a semiconductor manufacturing apparatus according to a fifth embodiment. The semiconductor manufacturing apparatus according to the fifth embodiment has the same structure as the semiconductor manufacturing apparatus according to the first embodiment shown in FIG. 2 except that the holder 100 immerses the substrate 300 in each tank in a light-shielded state and the covers 252 and 282 are not provided in the first plating tank 250 and the fourth plating tank 280.

Figure 13A:
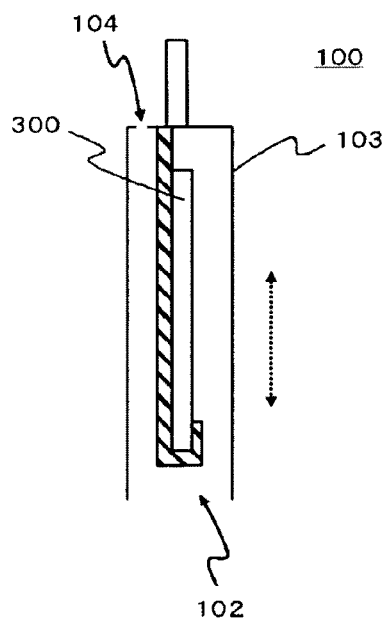
FIGS. 13A and 13B are cross-sectional views illustrating a holder.
Figure 13B:
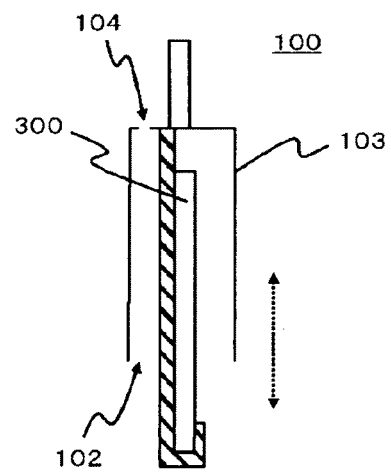

FIGS. 13A and 13B are cross-sectional views illustrating the holder 100. The holder 100 has a light shielding cover 103. The light shielding cover 103 surrounds the substrate 300 and has an opening portion 102 formed in the lower surface thereof. The treatment solution in each tank flows into the light shielding cover 103 through the opening portion 102. When the treatment solution flows into the light shielding cover 103, air in the light shielding cover 103 is discharged to the outside through an air vent hole 104 that is formed in the upper surface of the light shielding cover 103. The holder 100 is moved up and down as represented by a dotted line in FIGS. 13A and 13B, with the substrate 300 surrounded by the light shielding cover 103.

In the example shown in FIG. 13A, the lower end of the light shielding cover 103 protrudes downward from the lower end of the substrate 300. In the example shown in FIG. 13B, the lower end of the substrate 300 protrudes downward from the lower end of the light shielding cover 103. In the latter example, the substrate 300 is immersed in each tank in the shading environment.

According to this embodiment, the holder 100 immerses the substrate 300 in each tank in a light-shielded state. Therefore, even when the covers 252 and 282 are not provided in the first plating tank 250 and the fourth plating tank 280, it is possible to prevent photovoltaic power from being generated from the substrate 300. Therefore, it is not necessary to dispose the plating tank in the shading environment.

Figure 14:
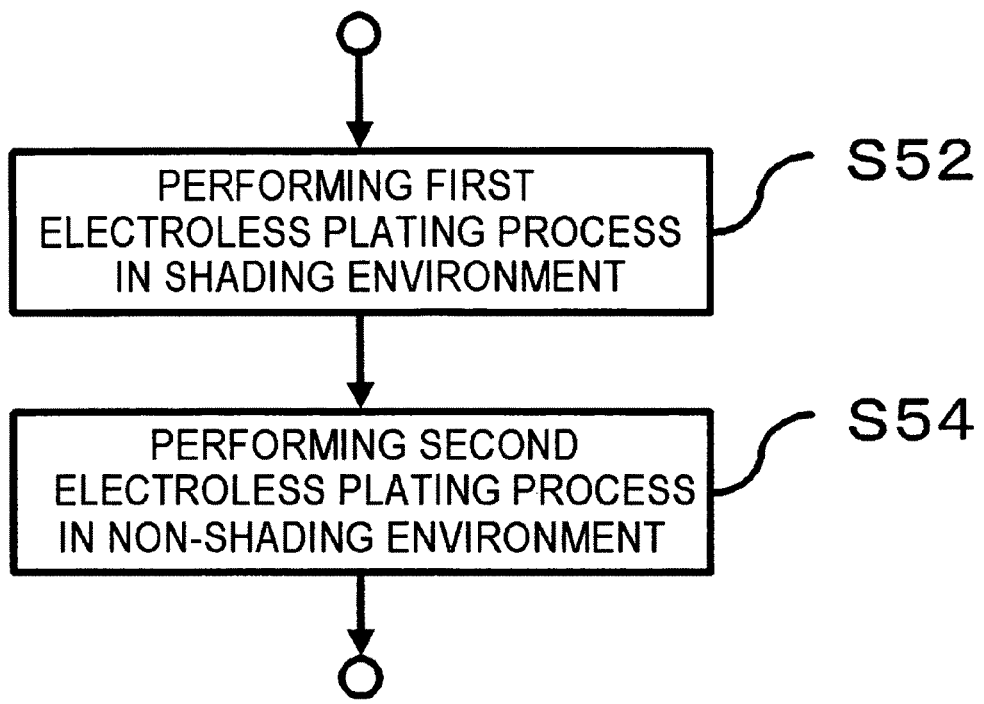
FIG. 14 is a diagram illustrating the structure of a semiconductor manufacturing apparatus according to a sixth embodiment.

FIG. 14 is a flowchart illustrating a method for manufacturing a semiconductor device according to a sixth embodiment. The method for manufacturing the semiconductor device forms a laminated structure of a plurality of metal films on a semiconductor substrate using the electroless plating method. A process of forming a metal film is performed using, for example, the first plating tank 250 and the third plating tank 270 of the semiconductor manufacturing apparatus shown in FIG. 2. That is, the process of forming the metal film includes an electroless plating process including the reduction reaction that is performed using the first plating tank 250 and an electroless plating process performed by only the substitution reaction using the third plating tank 270. The electroless plating process including the reduction reaction that is performed using the first plating tank 250 is performed in the shading environment, and the electroless plating process performed by only the substitution reaction using the third plating tank 270 is performed in the non-shading environment. The electroless plating process using the first plating tank 250 and the electroless plating process using the third plating tank have been described in detail in the first embodiment.

Figure 15:
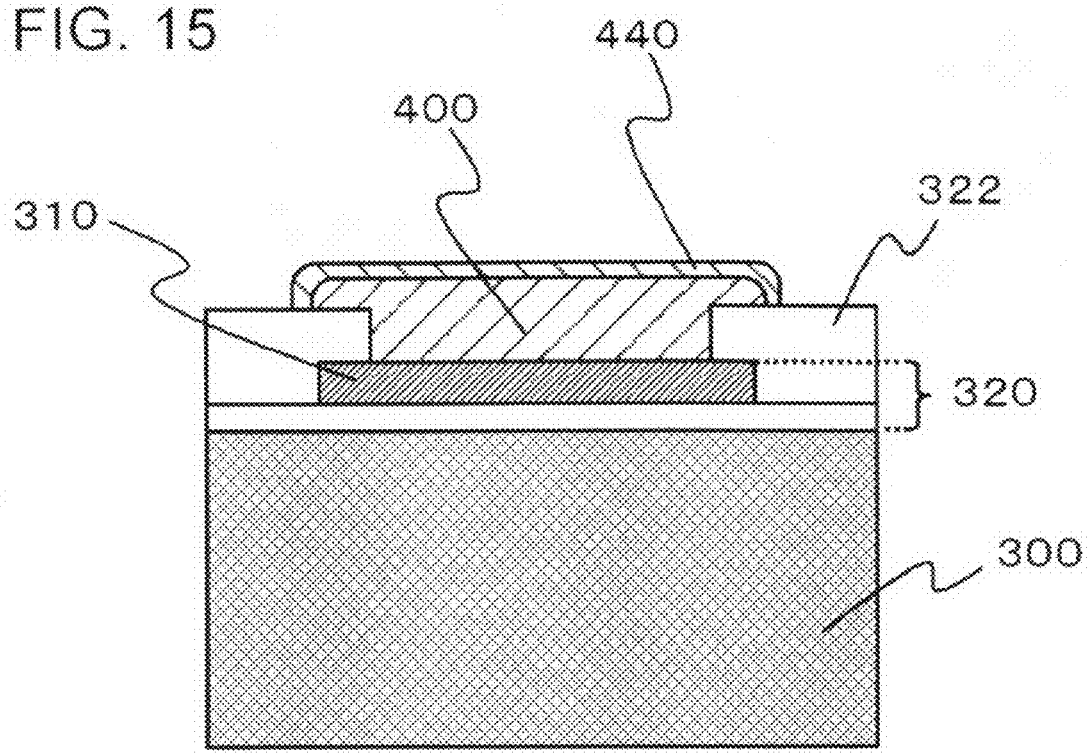
FIG. 15 is a cross-sectional view illustrating the structure of a semiconductor device according to the sixth embodiment.

FIG. 15 is a cross-sectional view illustrating a semiconductor device manufactured by this embodiment. The semiconductor device has the same structure as the semiconductor device according to the first embodiment shown in FIG. 4 except that it does not include the second plating film 420. That is, the first plating film 400 and the third plating film 440 are formed on the electrode pad 310. For example, when the electrode pad 310 is made of Cu, the first plating film 400 is a Ni-plated film with a thickness equal to or more than 1 μm and equal to or less than 10 μm, and the third plating film 440 is an Au-plated film with a thickness equal to or more than 0.01 μm and equal to or less than 0.05 μm.

In this embodiment, it is possible to obtain the same effects as those in the first embodiment.

The embodiments of the invention have been described above with reference to the drawings, but the invention is not limited thereto. The invention may have various structures other than the above structures.

It is apparent that the present invention is not limited to the above embodiments, but may be modified and changed without departing from the scope and spirit of the invention.

What is claimed is:

1. A method for manufacturing a semiconductor device, the method comprising:
    forming a laminated structure of a plurality of metal films on a semiconductor substrate using an electroless plating method,
    wherein said forming of the metal films includes:
        performing an electroless plating process including a reduction reaction using a first plating tank; and
        performing an electroless plating process by only a substitution reaction using a second plating tank,
    said electroless plating process including said reduction reaction that is performed using said first plating tank is performed in a shading environment, and
    said electroless plating process performed by only said substitution reaction using said second plating tank is performed in a non-shading environment.

2. The method for manufacturing a semiconductor device according to claim 1, wherein a plating solution used in said first plating tank includes a reducing agent.

3. The method for manufacturing a semiconductor device according to claim 1, wherein said forming of the metal films further includes performing an electroless plating process by only a substitution reaction using a third plating tank, and said electroless plating process performed by only said substitution reaction using said third plating tank is performed in said non-shading environment.

4. The method for manufacturing a semiconductor device as claimed in claim 3, wherein, in said performing of the electroless plating process including said reduction reaction using said first plating tank, a Ni film Or a metal film including Ni is formed, in said performing of the electroless plating process by only said substitution reaction using said second plating tank, a Pd film or a metal film including Pd is formed, in said performing of the electroless plating process by only said substitution reaction using said third plating tank, an Au film is formed, and said Ni film or said metal film including Ni, said Pd film or said metal film including Pd, and said Au film are formed in this order.

5. The method for manufacturing a semiconductor device as claimed in claim 4, wherein a plating solution used in said first plating tank includes a reducing agent, a plating solution used in said second plating tank includes a reducing agent, and a plating solution used in said third plating tank does not include a reducing agent.

6. The method for manufacturing a semiconductor device as claimed in claim 3, wherein said forming of the metal films further includes performing an electroless plating process including a reduction reaction using a fourth plating tank, and said electroless plating process including said reduction reaction that is performed using said fourth plating tank is performed in a shading environment.

7. The method for manufacturing a semiconductor device as claimed in claim 6, wherein said electroless plating process including said reduction reaction that is performed using said fourth plating tank is performed on said metal film which is formed by said electroless plating process performed by only said substitution reaction using said third plating tank, and in said performing of said electroless plating process including said reduction reaction using said fourth plating tank, a metal film is made of a same material as that forming said metal film which is formed by said electroless plating process performed by only the substitution reaction using said third plating tank.

8. The method for manufacturing a semiconductor device as claimed in claim 7, wherein a plating solution used in said fourth plating tank includes a reducing agent.

9. The method for manufacturing a semiconductor device as claimed in claim 6, wherein, in said performing of the electroless plating process including said reduction reaction using said first plating tank, a Ni film or a metal film including Ni is formed, in said performing of the electroless plating process by only said substitution reaction using said second plating tank, a Pd film or a metal film including Pd is formed, in said performing of the electroless plating process by only said substitution reaction using said third plating tank, a first Au film is formed, in said performing of the electroless plating process including said reduction reaction using said fourth plating tank, a second Au film is formed, and said Ni film or said metal film including Ni, said Pd film or said metal film including Pd, said first Au film, and said second Au film are formed in this order.

10. The method for manufacturing a semiconductor device as claimed in claim 1, wherein said metal films are formed on an electrode that is formed on said semiconductor substrate, and said electrode comprises a metal layer made of at least one of Cu, a metal material including Cu, Al, a metal material including Al, W, a metal material including W, Ag and a metal material including Ag, or a laminated structure of the metal films.

11. A semiconductor device manufacturing apparatus that forms a laminated structure of a plurality of metal films on a semiconductor substrate using an electroless plating method, the semiconductor device manufacturing apparatus comprising:

a first plating tank that performs an electroless plating process including a reduction reaction in a shading environment; and a second plating tank that performs an electroless plating process by only a substitution reaction in a non-shading environment.

12. The semiconductor device manufacturing apparatus as claimed in claim 11, further comprising:

a holder that holds said semiconductor substrate and immerses said semiconductor substrate in said first plating tank in a light-shielded state.

13. A method of forming metal films on a semiconductor substrate, the method comprising:

performing a first electroless plating process including a reduction reaction, the first electroless plating process being performed in a shading environment; and performing a second electroless plating process including a substitution reaction, the second electroless plating process being performed in a non-shading environment.

14. The method according to claim 13, wherein the first electroless plating process is performed using a plating tank having a cover provided at an opening thereof.

15. The method according to claim 14, wherein the cover includes an opaque material.

16. The method according to claim 14, wherein the plating tank is configured to hold a plating solution, and the cover includes a material that is not corroded by the plating solution.

17. The method according to claim 14, further comprising:

opening the cover to receive the semiconductor substrate; and closing the cover during the first electroless plating process.

18. The method according to claim 13, further comprising performing a third electroless plating process in a shading environment.

19. The method according to claim 18, wherein the second electroless plating process is performed before the third electroless plating process.

20. The method according to claim 19, wherein the first electroless plating process is performed before the second electroless plating process.

* * * * *